United States Patent
Noh

(10) Patent No.: US 6,191,984 B1
(45) Date of Patent: Feb. 20, 2001

(54) REDUNDANCY CIRCUIT CAPABLE OF DISABLING USE OF REDUNDANT MEMORY CELLS THAT ARE DEFECTIVE

(75) Inventor: Kyong-jun Noh, Anyang (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/478,267

(22) Filed: Jan. 5, 2000

(30) Foreign Application Priority Data

Apr. 28, 1999 (KR) .................................................. 99-15204

(51) Int. Cl.$^7$ ....................................................... G11C 7/00
(52) U.S. Cl. ........................................ 365/200; 365/230.06
(58) Field of Search ................................ 365/200, 225.7, 365/230.06, 201

(56) References Cited

U.S. PATENT DOCUMENTS

| | | | |
|---|---|---|---|
| 5,568,061 | * 10/1996 | McClure | 326/13 |
| 5,621,691 | * 4/1997 | Park | 365/200 |
| 5,828,624 | * 10/1998 | Baker et al. | 365/230.06 |
| 6,041,000 | * 3/2000 | McClure et al. | 365/200 |
| 6,118,712 | * 9/2000 | Park et al. | 365/200 |

* cited by examiner

*Primary Examiner*—Richard Elms
*Assistant Examiner*—Anh Phung
(74) *Attorney, Agent, or Firm*—Skjerven Morrill Macpherson LLP; David Millers

(57) ABSTRACT

A redundancy circuit is capable of repeatedly replacing a defective cell with redundant cells. The redundancy circuit is in a semiconductor memory device that includes memory cells and redundant cells in a memory array. The redundancy circuit includes first and second fuse blocks. The first fuse block has a first main fuse and generates a first redundancy signal according to whether the first main fuse is cut. The first redundancy signal indicates whether there is a defective memory cell for the redundancy circuit to replace. The second fuse block has a second main fuse and generates a second redundancy signal according to whether the second main fuse is cut. The second redundancy signal can stop the replacement of the defective cell with the redundant cell when the redundant cell is defective. When the replacement of the defective cell with the redundant cell is stopped, the defective cell is replaced by another redundant cell.

9 Claims, 2 Drawing Sheets

REDUNDANCY CIRCUIT CAPABLE OF DISABLING USE OF REDUNDANT MEMORY CELLS THAT ARE DEFECTIVE

BACKGROUND OF THE INVENTION

1. Field of the Invention

The present invention relates to a semiconductor memory device, and more particularly, to a redundancy circuit capable of replacing defective redundant cells with other redundant cells.

2. Description of the Related Art

Semiconductor devices have become faster and more highly integrated. However, even with the high level of integration, fabrication processes must still provide high integrated circuits yield to reduce costs. In particular, producing economically competitive semiconductor memory devices such as high capacity DRAMs requires high yield together with high integration.

A conventional semiconductor memory device includes many memory cells. However, if one of the memory cells does not operate properly, the semiconductor memory device will not function properly. This problem is a particular concern for highly integrated devices. With higher levels of integration of semiconductor memory devices, the number of memory cells and the probability of defects increase. Such defects are likely to be in more than one memory cell. Defective memory cells thus become one of the main factors in lowering the yield of semiconductor memory devices.

A redundancy circuit improves yield by replacing a defective cell in a semiconductor memory device with a spare or redundant cell that allows the memory device to function properly. Generally, the redundancy circuit connects to a block of redundant memory cells arranged in columns and rows, and selects a set of redundant memory cell from the block to replace a set of memory cells including the defective cell. In particular, the redundancy circuit responds to an address signal corresponding to a defective cell in the main array by accessing a redundant memory cell instead of the defective cell.

U.S. Pat. No. 5,325,334 discloses a known method of replacing defective cells with redundant cells. According to that method, a plurality of fuses within a fuse box array are programmed (i.e., selectively cut or burnt) so that the redundancy circuit responds to a column address signal corresponding to a defective column. Multiple fuse boxes are in the fuse box array to allow repair of multiple defective columns. Each of the fuse boxes includes fuses, which are selectively programmed according to a column address of a corresponding defective column. In response to column address signals corresponding to the defective column, a control circuit, including the fuse box programmed to correspond to the defective column, drives the gate of a redundant column driver to select a redundant column. This redirects access operations to the selected redundant column and thereby replaces defective cells with redundant cells.

However, in the U.S. Pat. No. 5,325,334, when a redundant cell that replaces a detective cell is also defective, the defective redundant cell cannot be replaced by another redundant cell. Thus, the semiconductor memory device is defective and must be discarded. Accordingly, with the known redundancy circuits, redundant memory cells that are defective lower the yield of operable semiconductor memory devices.

SUMMARY OF THE INVENTION

In accordance with an aspect of the present invention, a redundancy circuit can repeatedly replace a defective cell with redundant cells until an operable redundant cell is found.

One embodiment of the present invention is a redundancy circuit for replacing defective memory cells with redundant cells. This redundancy circuit includes first and second fuse blocks, a control unit, and a decoding unit. The first fuse block includes a first main fuse and generates a first redundancy signal according to whether the first main fuse is cut. The first redundancy signal indicates a defective cell requires replacement with a redundant cell. The second fuse block has a second main fuse and generates a second redundancy signal according to whether the second main fuse is cut. The second redundancy signal stops replacement of the defective cell with the redundant cell when the redundant cell is defective. The control unit generates an enable signal in response to the first and second redundancy signals. The decoding unit generates a selection signal for selecting the redundant cell in place of the defective cell, in response to the enable signal and an address corresponding to the defective cell. When the redundant cell is defective, the defective redundant cell is not selected, and another redundant cell can replace the defective cell.

In this way, the redundancy circuit increases the probability of replacing defective cells with operable redundant cells and improves the yield of working semiconductor memory devices.

BRIEF DESCRIPTION OF THE DRAWINGS

The aspects and advantage of the present invention will become more apparent in view of the following description of embodiments thereof with reference to the attached drawings in which.

Reference symbols repeated in the drawings denote the same elements.

DESCRIPTION OF THE PREFERRED EMBODIMENT

In accordance with an aspect of the invention, a redundancy circuit replaces defective cells with redundant cells in a semiconductor memory device. If a redundant cell is defective, the redundancy circuit disables use of the defective redundant cell, and replaces the defective cell with another redundant cell. The redundancy circuit can repeat the process of disabling defective redundant cells and selecting other redundant cells to replace defective memory cells until operable redundant cells are found or the available redundant cells are exhausted.

Figure 1:
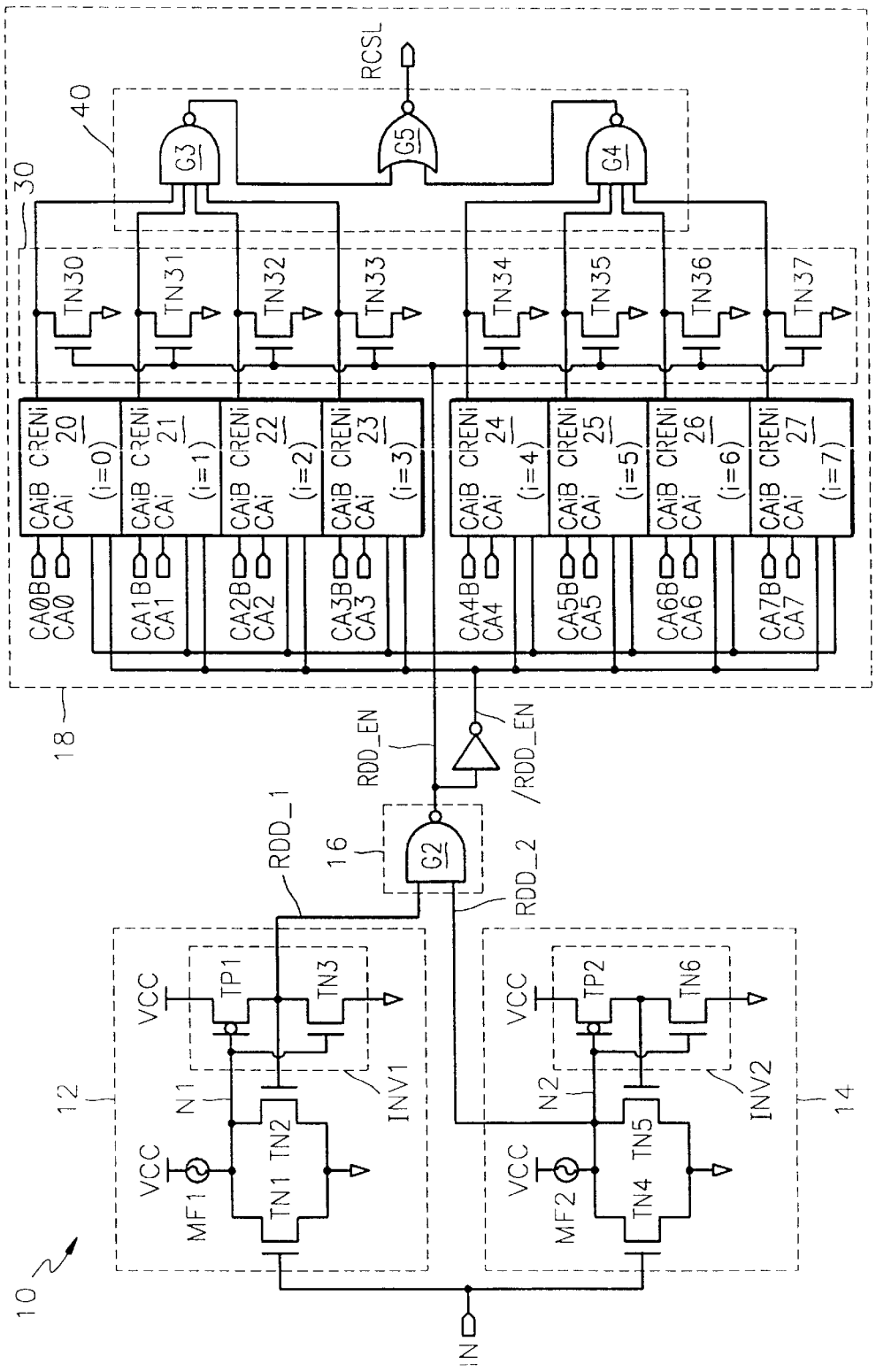
FIG. 1 is a circuit diagram of a redundancy circuit according to an embodiment of the present invention that can repeatedly replace a defective cell with redundant cells.

FIG. 1 shows a redundancy circuit 10 according to an embodiment of the present invention. The redundancy circuit 10 includes a first fuse block 12, a second fuse block 14, a control unit 16, and a decoding unit 18. The first fuse block 12 receives a pulse signal IN when a semiconductor memory device (not shown) starts and in response generates a first redundancy signal $RDD_{13}$ 1. The first fuse block 12 includes a first main fuse MF1 for selection of a redundant cell (typically in a row or column of redundant cells) associated with the redundancy circuit 10. The non-cut state of the first main fuse MF1 represents that the redundant cell has not been selected for use, and the cut state of the first main fuse MF1 represents that a defective memory cell requires replacement.

When the first main fuse MF1 is uncut and a power supply voltage VCC is applied to the semiconductor memory device, the first main fuse MF1 charges a node N1 to the voltage level of the power supply voltage VCC. A transistor TN1 is between the node N1 and ground and has a gate coupled to receive the pulse signal IN. The pulse signal IN briefly has the logic "high" level when the semiconductor memory device powers up, and is generated by a row address strobe signal (/RAS). Accordingly, the transistor TN1 slightly lowers the voltage level of the node N1. However, the pulse signal IN transits to the logic "low" level and turns off the transistor TN1, so that the voltage level of the node N1 rises back to the power supply voltage VCC (i.e., the logic "high" level).

An inverter INV1, including transistors TP1 and TN3, generates a first redundancy signal $RDD_{13}$ 1, which has a logic level that is complementary to the logic level of the voltage on the node N1. In particular, when the first main fuse MF1 is uncut, the first redundancy signal $RDD_{13}$ 1 has a logic "low" level because the node N1 has the logic "high" level. The inverter INV1 applies the first redundancy signal $RDD_{13}$ 1 to the gate of a transistor TN2. When the node N1 is at the logic "high" level, the inverter INV1 keeps the transistor TN2 off to maintain the logic "high" level on the node N1. The control unit 16, to be described later, receives the first redundancy signal $RDD_{13}$ 1 and prevents use of the associated redundant cells when the first redundancy signal $RDD_{13}$ 1 has the logic "low" level. This would be the case when no normal memory cell requires replacement by the redundant memory cell associated with the redundancy circuit 10.

When the first main fuse MF1 is cut, a logic "high" level pulse in the signal IN turns on the transistor TN1, which pulls the voltage level of the node N1 close to the ground voltage. The transistor TN1 turns off when the signal IN transits back to the logic "low" level. However, the main fuse MF1 is cut and does not supply the power supply voltage VCC to charge the node N1. Accordingly, the node N1 remains close to the ground voltage, that is, at a logic "low" level. Additionally, the logic "low" level on the node N1 causes the inverter INV1 to turn on the transistor TN2, which maintains the logic "low" level at the node N1. The inverter INV1 raises the voltage level of the first redundancy signal $RDD_{13}$ 1 to the logic "high" level in response to the node N1 being at the logic "low" level. In response to the first redundancy signal $RDD_{13}$ 1 being at the logic "high" level, the control unit 16 can activate a redundancy operation. Thus, when a normal memory cell is defective, the first main fuse MF1 is cut to enable replacing the defective normal memory cell with a redundant cell corresponding to redundancy circuit 10. When a normal cell is defective, a word line or bit line connected to the normal memory cell is cut to prevent selection of the normal memory cell.

The second fuse block 14 has a second main fuse MF2 that is cut or not to enable or disable the replacement of the defective cell with a redundant cell corresponding to redundancy circuit 10. The non-cut state of the second main fuse MF2 enables the replacement of a defective cell with a redundant cell, and the cut state of the second main fuse MF2 disables the replacement of the defective cell with the corresponding redundant cell.

When the second main fuse MF2 is uncut and the power supply voltage VCC is applied to the semiconductor memory device, the second main fuse MF2 raises the level of a second redundancy signal $RDD_{13}$ 2 to the level of the power supply voltage VCC. A transistor TN4 turns on in response to the logic "high" level pulse in the signal IN, causing the voltage level of the second redundancy signal $RDD_{13}$ 2 to drop slightly. However, the transistor TN4 turns off when the signal IN returns to the logic "low" level, and the voltage level of the second redundancy signal $RDD_{13}$ 2 remains at the logic "high" level. An inverter INV2, which includes transistors TP2 and TN6, receives the second redundancy signal $RDD_{13}$ 2 and applies an inverted signal to the gate of a transistor TN5. When the second redundancy signal $RDD_{13}$ 2 has the logic "high" level, the inverter INV2 turns off transistor TN5 to maintain the logic "high" level of the second redundancy signal $RDD_{13}$ 2. The control unit 16 receives the logic "high" level of the second redundancy signal $RDD_{13}$ 2 and generates a redundancy enable signal $RDD_{13}$ EN according to the logic level of the first redundancy signal $RDD_{13}$ 1 from the first fuse block 12.

When the second main fuse MF2 is cut, the transistor TN4 turns on in response to the logic "high" level pulse in the signal IN and lowers the voltage level of the second redundancy signal $RDD_{13}$ 2 to close to the ground voltage. The second main fuse MF2, being cut, no longer supplies the power supply voltage VCC for the second redundancy signal $RDD_{13}$ 2. The transistor TN4 turns off when the signal IN falls to the logic "low" level, but the inverter INV2 turns on the transistor TN5, which keeps the second redundancy signal $RDD_{13}$ 2 at the logic "low" level. The control unit 16 in response to the second redundancy signal $RDD_{13}$ 2 being low blocks the first redundancy signal $RDD_{13}$ 1 and stops selection of the redundant cell associated with the redundancy circuit 10.

The control unit 16 generates the redundancy enable signal $RDD_{13}$ EN in response to the first and second redundancy signals $RDD_{13}$ 1 and $RDD_{13}$ 2. In the exemplary embodiment, the control unit 16 includes a two-input NAND gate G2, which receives the first and second redundancy signals $RDD_{13}$ 1 and $RDD_{13}$ 2. The redundancy enable signal $RDD_{13}$ EN is at the logic "low" level to enable use of the associated redundant cells when the first and second redundancy signals are both at the logic "high" level. Otherwise, the redundancy enable signal $RDD_{13}$ EN is at the logic "high" level to disable use of the associated redundant cells.

To be more specific, the control unit 16 generates a logic "high" level redundancy enable signal $RDD_{13}$ EN when the first redundancy signal $RDD_{13}$ 1 is at a logic "low" level and the second redundancy signal $RDD_{13}$ 2 is at a logic "high" level. This occurs when neither main fuse MF1 nor MF2 is cut and corresponds to a case when the redundant cell associated with the redundancy circuit 10 is not needed for replacement of a normal cell. The logic "high" level of the redundancy enable signal $RDD_{13}$ EN disables the decoding unit 18 to prevent selection of a redundant cell associated with redundancy circuitry 10. Therefore, the redundancy operation does not occur. Instead, a normal operation accesses a normal memory cell.

The level of the redundancy enable signal $RDD_{13}$ EN is a logic "low" level when the first and second redundancy signals $RDD_{13}$ 1 and $RDD_{13}$ 2 are at the logic "high" level. This occurs when the first main fuse MF1 is cut but the second main fuse MF2 is not cut and corresponds to the case where the redundant cell corresponding to the redundancy circuit 10 replaces a defective memory cell. The logic "low" level of the redundancy enable signal $RDD_{13}$ EN drives the decoding unit 18 to perform the redundancy operation in which a redundant cell replaces the defective cell.

The control unit 16 generates a logic "high" level for the redundancy enable signal $RDD_{13}$ EN in response to a logic "low" level second redundancy signal $RDD_{13}$ 2 regardless of the voltage level of the first redundancy signal $RDD_{13}$ 1. As described above, the logic "high" level redundancy enable signal $RDD_{13}$ EN disables the decoding unit 18 to prevent selection of a redundant cell. This may occur, for example, when a redundant cell associated with redundancy circuit 10 is found to be defective after the first main fuse MF1 is cut. Upon discovering the defective redundant cell, the second main fuse is cut to drive the second redundancy signal $RDD_{13}$ to the logic "low" level. The logic "low" level of the second redundancy signal $RDD_{13}$ 2 stops the replacement of a defective normal cell with the defective redundant cell. Another redundancy circuit, identical to the redundancy circuit 10, can then be programmed to replace the defective normal cell with another redundant cell.

The decoding unit 18 generates a redundancy selection signal RCSL for selecting a redundant cell corresponding to a defective cell address in response to the redundancy enable signal $RDD_{13}$ EN and an address signal. The decoding unit 18 includes a plurality of address coders 20 through 27, a redundancy disable unit 30, and a redundancy decoder 40. The number of address coders depends on the number of row or column address signal lines for addressing memory cells associated with the redundancy circuit 10. The exemplary embodiment of FIG. 1 has eight address coders 20 through 27 for eight column addresses, and the redundancy circuit 10 is associated with a column of redundant cells. Other redundancy circuits that are identical to redundancy circuit 10 are associated with other columns of redundant cells from a block of redundant cells. Typically, the block of redundant cells shares row lines with the memory cells in a memory array.

Figure 2:
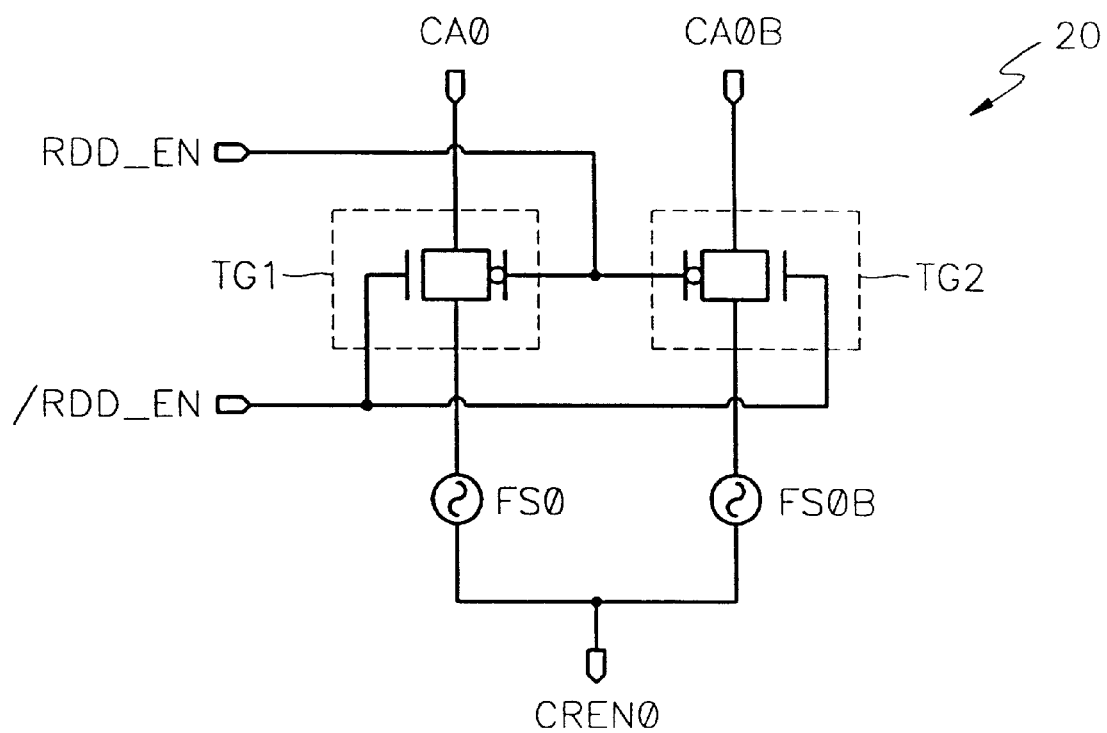
FIG. 2 is a circuit diagram of the address coding unit of FIG. 1.

FIG. 2 shows a circuit diagram representing the first address coder 20 for explanation of the eight address coders 20 through 27. In FIG. 2, the first address coder 20 includes transmission gates TG1 and TG2 and fuses FS0 and FS0B. Programming of address coder 20 cuts one of fuses FS0 and FS0B depending on an address bit corresponding from the column address of the column that redundancy circuit 10 is replacing. The first address coder 20 transmits an address signal CA0B or CA0 as a redundancy address CREN0 according to whether the fuse FS0 or FS0B is cut, in response to the redundancy enable signals $RDD_{13}$ EN and/ $RDD_{13}$ EN.

Referring back to FIG. 1, fuses FSi and FSiB (where i is 0 to 7) in the address coders 20 through 27 are cut in accordance with a column address of the defective cell (or column). For example, if a column address signal [CA7:CA0] corresponding to 00000001b would select the defective memory cell being replaced, the fuses FS0 and FSiB (where i is 1 to 7) are not cut, and the fuses FS0B and FSi (where i is 1 to 7) are cut. (More generally, when the column address signal [CA7:CA0] corresponds to the memory cell being replaced, the uncut fuses receive logic "high" level column address bits, and the cut fuses receive the logic "low" level column address signals.) In the address coder 20 of FIG. 2, the logic "low" level for the redundancy enable signal $RDD_{13}$ EN turns on transmission gates TG1 and TG2, and the fuse FS0 transmits the logic "high" level column address signal CA0 as the first redundancy address CREN0. The fuse FS0B, being cut, does not transmit the first logic "low" level of column address CA0B.

Accordingly, in the plurality of address coders 20 through 27 of FIG. 1, programming selectively cuts fuses FSi and FSiB (where i is 0 to 7) to correspond to the address of the defective cell being replaced. As a result, when the column address signal [CA7:CA0] corresponds to the defective cell being replaced, the decoding unit 18 transmits the logic "high" level of column address signals CAi or CAiB (where i is 0 to 7) to the logic "high" level redundancy addresses CRENi (where i is 0 to 7). The redundancy decoder 40 receives the logic "high" level redundancy addresses CRENi (where i is 0 to 7) and activates the redundant cell selection signal RCSL for selecting a redundant cell.

The redundancy disable unit 30 includes transistors TNi (where i is 30 to 37) coupled between the output terminals of respective coders 20 to 27 and ground. The logic "high" level redundancy enable signal $RDD_{13}$ EN turns on transistors TNi, which then pull redundancy addresses CRENi (where i is 0 to 7) to the logic "low" level. The logic "low" level redundancy addresses CRENi (where i is 0 to 7) when applied to the redundancy decoder 40 deactivate the redundant cell selection signal RCSL to a logic "low" level. Therefore, the redundancy enable signal $RDD_{13}$ EN can disable selection of the redundant cells associated with the redundancy circuit 10.

The redundancy decoder 40 includes logic gates G3, G4, and G5, and generates a logic "high" level redundant cell selection signal RCSL in response to the logic "high" level on all of the redundancy addresses CRENi (where i is 0 to 7). In particular, the four-input NAND gate G3 receives first through fourth redundancy addresses CRENi (where i is 0 to 3) and provides a logic "low" level output when the first through fourth redundancy address signals are all at the logic "high" level. The four-input NAND gate G4 receives fifth through eighth redundancy addresses CRENi (where i is 4 to 7) and provides a logic "low" level output when the fifth through eighth redundancy address signals are all at the logic "high" . A two-input NOR gate G25, which receives the logic "low" level outputs of the four-input NAND gates G3 and G4, asserts the selection signal RCSL to the logic "high" level. The logic "high" level redundant cell selection signal RCSL selects a redundant cell to replace a defective cell. In FIG. 1, the redundancy decoder 40 includes the four-input NAND gates G3 and G4 and the 2-input NOR gate G5 as an example of a decoder for decoding the redundancy addresses CRENi (where i is 0 to 7). However, methods of designing other decoder circuits for generating the logic "high" level redundant cell selection signal RCSL from the supplied logic "high" level redundancy addresses CRENi (where i is 0 to 7) will occur to those skilled in the art.

To repair a device containing defective memory cells, the redundancy circuit 10 generates a logic "low" level redundancy enable signal $RDD_{13}$ EN when the first main fuse MF1 is cut and the second main fuse MF2 is uncut. As a result, the first redundancy signal $RDD_{13}$ 1 and the second redundancy signal $RDD_{13}$ 2 are both at the logic "high" level. Fuses FSi and FSiB (where i is 0 to 7) in the address coders 20 through 27 are selectively cut and coded according to the address of the defective memory cell being replaced. The address coders 20 through 27 generate logic "high" level redundancy address signals CRENi (where i is 0 to 7) in response to a logic "low" level redundancy enable signal $RDD_{13}$ EN and address signals CAi and CAiB (where i is 0 to 7) corresponding to the defective memory cell. Then, the redundancy decoder 40 generates a logic "high" level redundant cell selection signal RCSL in response to the logic "high" level redundancy address signals CRENi (where i is 0 to 7), so that a redundant cell is selected to replace a defective cell. For example, the selection signal RCSL activates a driver circuit for the column of redundant cells corresponding to the redundancy circuit 10.

If a redundant cell to replace a defective cell is defective, the repair operation cuts the second main fuse MF2, and the redundancy circuit 10 generates a logic "high" level redundancy enable signal RDD$_{13}$ EN in response to the second logic "low" level redundancy signal RDD$_{13}$ 2. The logic "high" level redundancy enable signal RDD$_{13}$ EN turns on transistors TNi (where i is 30 to 37) in the redundancy disable unit 30 and generates the logic "low" level redundancy addresses CRENi (where i is 0 to 7). (The logic "high" level of the redundancy enable signal RDD$_{13}$ EN also disables signal transmission through coders 20 to 27.) The redundancy decoder 40 generates a logic "low" level redundant cell selection signal RCSL in response to the logic "low" level redundancy addresses CRENi (where i is 0 to 7). At this time, selection of the defective redundant cell intended to replace a defective cell is stopped. Thereafter, another redundancy circuit 10 is used so that another redundant cell replaces the defective cell.

The redundancy circuit 10 according to the present invention replaces a defective cell with a redundant cell, stops the replacement of the defective cell with a defective redundant cell, and replaces the defective redundant cell with another redundant cell when the redundant cell is defective. Thus, the memory devices having redundancy circuits 10 have a higher probability of repair when compared to the prior art in which a defective cell can only be replaced by one redundant cell.

Although the invention has been described with reference to a particular embodiment, the description is only an example of the invention's application and should not be taken as a limitation. In particular, even though much of preceding discussion was aimed at a redundancy circuit including programmable fuses, alternative embodiments of this invention include redundancy circuits employing antifuses or other programmable elements, that can be programmed to indicate a redundancy operation for is a defective memory cell and to disable the redundancy operation when an associated redundant cell is defective. Various other adaptations and combinations of features of the embodiments disclosed are within the protected scope of the invention as defined by the following claims.

What is claimed is:

1. A redundancy circuit for replacing defective memory cells with redundant cells, in a semiconductor memory device, the redundancy circuit comprising:

a first fuse block that includes a first main fuse and generates a first redundancy signal according to whether the first main fuse is cut, the first redundancy signal indicating whether there is a defective memory cell for the redundancy circuit to replace with a first redundant cell; and a second fuse block that includes a second main fuse and generates a second redundancy signal according to whether the second main fuse is cut, the second redundancy signal indicating whether to stop replacement of the defective cell with the first redundant cell.

2. The redundancy circuit of claim 1, wherein when the second redundancy signal stops replacement of the defective cell by the first redundant cell, the defective cell is replaced by a second redundant cell.

3. The redundancy circuit of claim 1, wherein when the first main fuse is cut, the first redundancy signal indicates there is a defective memory cell to be replaced.

4. The redundancy circuit of claim 1, wherein when the second main fuse is cut, the second redundancy signal stops replacement of the defective cell by the first redundant cell.

5. The redundancy circuit of claim 1, wherein the first and second fuse blocks generate the first and second redundancy signals, respectively, in response to a predetermined pulse signal generated when the semiconductor memory device is initialized, when the fuses are cut.

6. The redundancy circuit of claim 1, further comprising:

a control unit that generates a redundancy enable signal in response to the first and second redundancy signals; and a decoding unit that generates a selection signal for selecting the first redundant cell in response to the redundancy enable signal and an address signal corresponding to an address of the defective cell.

7. The redundancy circuit of claim 6, wherein the first and second fuse blocks generate the first and second redundancy signals, respectively, in response to a predetermined pulse signal generated when the semiconductor memory device is initialized, when the fuses are cut.

8. The redundancy circuit of claim 6, wherein the decoding unit comprises a plurality of fuses that are selectively cut according to the address of the defective cell, so that the decoding unit generates the selection signal in response to the redundancy enable signal and the address signal representing to the address of the defective cell.

9. The redundancy circuit of claim 6, wherein the decoding unit deactivates a redundancy address corresponding to the address of the defective cell in response to the redundancy enable signal when the replacement with the first redundant cell is stopped.

* * * * *